United States Patent [19]

Suzuki

[11] Patent Number: 4,857,381
[45] Date of Patent: Aug. 15, 1989

[54] REINFORCED DIELECTRIC SHEET

[75] Inventor: Hirosuke Suzuki, Saitama, Japan

[73] Assignee: Junkosha Co., Ltd., Japan

[21] Appl. No.: 190,458

[22] Filed: May 5, 1988

Related U.S. Application Data

[63] Continuation-in-part of Ser. No. 91,645, Aug. 31, 1987, abandoned.

[30] Foreign Application Priority Data

Mar. 17, 1986 [JP] Japan .................................. 61-38470

[51] Int. Cl.$^4$ .................................................. B32B 7/00
[52] U.S. Cl. ..................................... 428/120; 428/195;
428/319.3; 428/413; 428/422; 428/901; 174/36;
174/117 F
[58] Field of Search .............. 174/36, 117 F; 428/120,
428/195, 319.9, 422, 901

[56] References Cited

U.S. PATENT DOCUMENTS

| | | | |
|---|---|---|---|
| 2,789,076 | 4/1957 | Frieder et al. | 428/120 |
| 3,446,692 | 5/1969 | Turnbull | 428/120 |
| 3,614,848 | 10/1971 | Hitch | 428/120 |
| 4,451,527 | 5/1984 | Olyphant, Jr. | 428/220 |
| 4,452,657 | 6/1984 | Hamm | 428/120 |
| 4,514,450 | 4/1985 | Nowobilski et al. | 428/120 |
| 4,518,737 | 5/1985 | Traut | 524/413 |
| 4,591,659 | 5/1986 | Leibowitz | 174/68.5 |
| 4,639,693 | 1/1987 | Suzuki et al. | 174/117 F |
| 4,640,866 | 2/1987 | Suzuki | 428/422 |
| 4,680,220 | 7/1987 | Johnson | 428/241 |

Primary Examiner—Ellis P. Robinson
Assistant Examiner—P. J. Ryan
Attorney, Agent, or Firm—Mortenson & Uebler

[57] ABSTRACT

A reinforced porous dielectric sheet of expanded polytetrafluoroethylene is provided wherein solid plastic reinforcement elements in the form of circular columns or wall-like partitions extending through the dielectric sheet from one surface to the other are distributed within the sheet. The reinforced sheet is useful as a substrate for printed circuit boards. The reinforcement elements are preferably of a tetrafluoroethylene/ethylene copolymer or an epoxy resin.

4 Claims, 1 Drawing Sheet

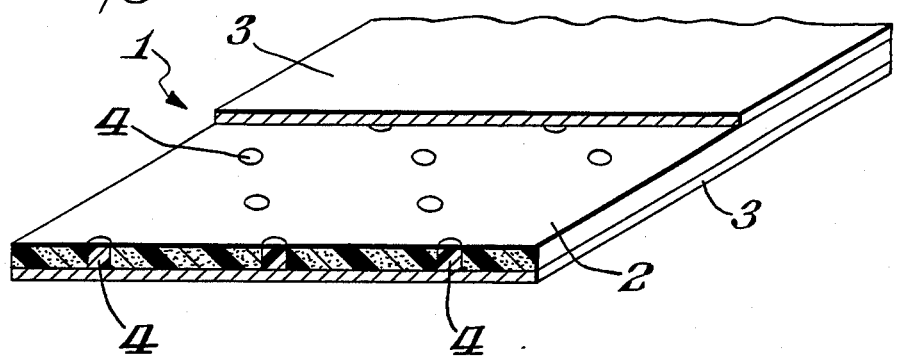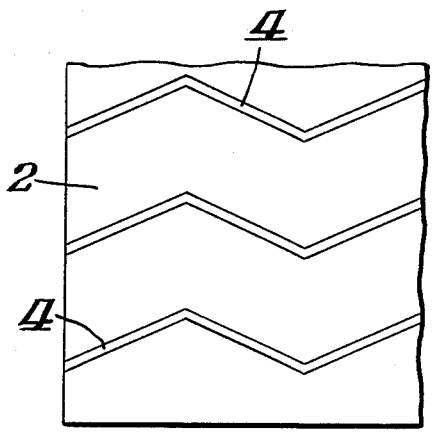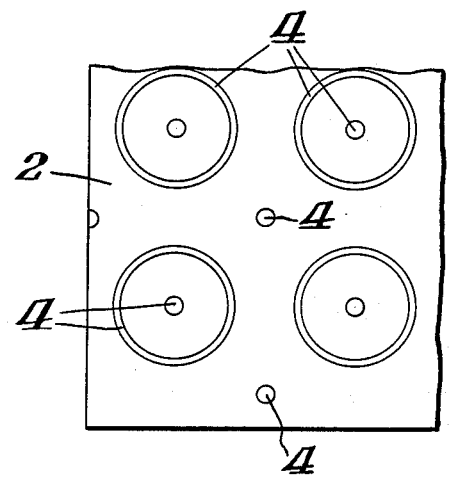

REINFORCED DIELECTRIC SHEET

CROSS-REFERENCE TO RELATED APPLICATION

This application is a continuation-in-part of U.S. Ser. No. 07/091,645, filed Aug. 31, 1987 now abandoned.

BACKGROUND OF THE INVENTION

This invention relates to a reinforcement structure for an inner layer sheet made of a porous dielectric material to be used in multilayer units, such as multilayer printed circuit boards or multilayer printed wiring boards, formed by etching wiring patterns in metal sheets, or by laminating several metal sheets.

Heretofore sheets used for the inner layers of laminated metal sheets and laminated printed circuit boards made using heat-curable materials often had a high dielectric constant. More specifically, inner layers of multilayer structures formed of a porous dielectric material have been proposed, especially in cases where it is necessary to satisfy such requirements as shortening of time delay in transmission of signals between printed circuits in multilayer printed circuit boards made of the above mentioned laminated metal layers, or having etched patterns, reduction in electrostatic capacity, reduction of space between the wiring elements to provide for an increase in density of the elements, etc.

However, the above mentioned internal layer sheets made from porous dielectric material can be easily crushed in the thickness direction because of the porous nature of the electric material. This crush is especially noticeable when the above mentioned porous dielectric material has continuous pores. In that case, dimensional stability of the inner layer in the thickness direction is considerably impaired. When damage occurs in the inner layer sheet, printed circuits formed in this sheet experience problems associated with the above mentioned requirements, such as shortening of signal transmission delay time, etc.

SUMMARY OF THE INVENTION

A reinforced porous dielectric sheet is provided comprising a porous dielectric sheet having at least three solid plastic reinforcement elements extending through the dielectric sheet from one surface to the other, the reinforcement elements being distributed within the sheet. The dielectric sheet may be porous, expanded polytetrafluorethylene. The number and size of the reinforcement elements are limited so as not to substantially increase the permittivity and loss of the dielectric. The reinforcement elements may be in the form of circular columns or wall-like partitions, preferably made of tetrafluoroethylene/ethylene copolymer or epoxy resin. The reinforced porous dielectric sheet may be used as the substrate for a printed circuit board. In the case of highly complex circuits, the number of elements should be increased and their cross-section decreased.

BRIEF DESCRIPTION OF THE DRAWINGS

FIG. 1 is a perspective view, partly in cross-section, which illustrates one embodiment according to the present invention.

FIG. 2 is a top plan view which shows a specific distribution of wall-like partition reinforcement elements distributed within a porous dielectric sheet.

FIG. 3 is a top plan view of another distribution of reinforcement elements within a porous dielectric sheet.

DETAILED DESCRIPTION OF THE INVENTION AND PREFERRED EMBODIMENTS WITH REFERENCE TO THE DRAWINGS

A reinforced porous dielectric sheet of expanded polytetrafluoroethylene is provided wherein solid plastic reinforcement elements in the form of circular columns or wall-like partitions extending through the dielectric sheet from one surface to the other are distributed within the sheet. The reinforced sheet is useful as a substrate for printed circuit boards. The reinforcement elements are preferably of a tetrafluoroethylene/ethylene copolymer or an epoxy resin.

Specifically, the present invention provides a reinforcement structure for the inner layer sheet of a porous dielectric material, the structure being characterized by being formed of reinforcement elements made of a solid, hard dielectric material oriented in the thickness direction of the sheet, the reinforcement elements being distributed in the form of circular columns or wall-like partitions.

The inner layer sheet of the inventiom will therefore have an increased resistance to crushing because it is reinforced in the thickness direction by these reinforcement elements. Thus, without losing the porosity of the inner layer sheet, it becomes possible to maintain the required properties, such as a short signal transmission delay time of the printed circuit, reduced electrostatic capacity, reduced space between wiring elements in high-density patterns, etc. As the reinforcement elements are distributed in the form of circular columns or wall-like partitions and do not occupy a large area, they do not impair the main characteristics of the inner layer sheet.

An example of the present invention is shown in FIG. 1, which illustrates the structure of a porous inner sheet 2 in a laminated composite 1. The above mentioned laminated composite is formed of an inner sheet 2, preferably made of a 50 micrometer thick sheet with continuous pores such as porous, expanded polytetrafluoroethylene (PTFE), and of 25 micrometer thick metal sheets 3 affixed to one or both surfaces of sheet 2, such as, for example, by an adhesive. When the above mentioned metal sheets are made of copper, the laminated composite is called a copper laminated sheet. When metal sheets 3 of laminated metal sheet 1 are formed by pattern etching, the unit comprises a multilayer printed wiring board, or when these sheets are used for attachment of electronic elements of an integrated circuit, the unit comprises a printed circuit board. In any case, laminated composite 1 comprises a basic element of a printed wiring board or printed circuit board.

The above mentioned inner layer sheet has reinforcement elements 4, which are made of a solid, hard dielectric material oriented in the thickness direction of the sheet in the form of circular columns having a diameter of 40 micrometers. These elements protect inner layer sheet 2 from crushing. Reinforcement elements 4, which are shown in the drawing, pass through the entire thickness of inner layer sheet 2 so that the top and bottom ends of these elements are exposed, but alternatively they may not be exposed but rather are fully embedded in the material of inner layer sheet 2. In the embodiment illustrated in FIG. 1, reinforcement elements 4 are in the form of circular columns, but they also may have a linear distribution pattern in the form of wall-like partitions shown in FIG. 2, or a combined pattern, consisting, as shown in FIG. 3, of circular columns and wall-like partitions. The specific distribution pattern of reinforcement elements 4 is selected with regard to the material and porosity of inner layer sheet 2 and the pattern of printed wiring elements formed by pattern etching.

Reinforcement elements 4 can be installed in inner layer sheet 2 of a dielectric material when the latter is in a molten state, and then the dielectric material is cured, fixing the reinforcement elements. For example, the elements molded from a tetrafluoroethylene/ethylene copolymer resin or an epoxy resin can be inserted into a molten material of inner layer sheet 2 and then cured, or, in accordance with another version, the above mentioned dielectric material can be poured in a molten state into holes preliminarily formed in the inner layer sheet 2. The molten material is then cured. Solid reinforcement elements made of dielectric material can be pressed into the above mentioned holes.

In the case where inner layer sheet 2 is made of a porous polytetrafluoroethylene, the sheet possesses a relatively low dielectric constant and low dielectric loss. The above described distribution patterns of reinforcement elements 4 protects the inner layer sheet 2 from deterioration, and thus maintains its properties mentioned above.

A printed wiring board or printed circuit board is formed by laminating the inner layer sheet 2 to a metal sheet(s) 3. Therefore, it is preferable that surfaces of the inner layer sheet 2 be provided with an adhesive layer, but it is also possible that the surface of the sheet itself has adhesive properties.

Because, as has been shown above, according to the present invention, the inner layer sheet is reinforced by means of reinforcement elements oriented in the direction of the sheet thickness, these elements improve the resistance of the sheet to crushing. The improved resistance to crushing, in turn, protects the inner layer sheet from deterioration of its porosity and makes it possible to satisfy requirements of printed circuit boards, such as a shortened signal transmission delay time, reduced electrostatic capacity, reduced space between wiring elements in highly compact devices, and other properties necessary for preserving the inner layer sheet electrical functions.

With a circular column or wall-like partition distribution pattern of the reinforcement elements, the latter do not occupy excessive space and they do not impair such properties of the inner layer sheet such as low dielectric constant, or dielectric loss, which stems from the porous structure of the inner layer sheet.

While the invention has been disclosed herein in connection with certain embodiments and detailed descriptions, it will be clear to one skilled in the art that modifications or variations of such details can be made without deviating from the gist of the invention, and such modifications of variations are considered to be within the scope of the claims hereinbelow.

What is claimed is:

1. A reinforced porous dielectric sheet comprising a porous dielectric sheet of expanded, porous polytetrafluoroethylene having at least three solid reinforcement elements of another plastic extending through said dielectric sheet from one surface to the other, said reinforcement elements being distributed within the sheet, wherein said other plastic is selected from the class consisting of tetrafluoroethylene/ethylene copolymer and epoxy resin.

2. The reinforced porous dielectric sheet of claim 1 wherein said reinforcement elements are in the form of circular columns.

3. The reinforced porous dielectric sheet of claim 1 wherein said reinforcement elements are in the form of wall-like partitions.

4. The reinforced porous dielectric sheet of claim 1 as the substrate for a printed circuit board.

* * * * *